(12) United States Patent
Yoon (10) Patent No.: US 8,493,805 B2
(45) Date of Patent: Jul. 23, 2013

(54) SEMICONDUCTOR APPARATUS (75) Inventor: Hyun Su Yoon, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 385 days.

(21) Appl. No.: 12/982,067

(22) Filed: Dec. 30, 2010

(65) Prior Publication Data

US 2012/0081985 A1  Apr. 5, 2012

(30) Foreign Application Priority Data

Sep. 30, 2010  (KR) .................. 10-2010-0095627

(51) Int. Cl.
*G11C 7/02* (2006.01)

(52) U.S. Cl.
USPC .............. 365/207; 365/185.23; 365/230.03; 365/230.04; 365/230.06

(58) Field of Classification Search
USPC .............. 365/207, 185.23, 230.03, 230.04, 365/230.06
See application file for complete search history.

(56) References Cited

U.S. PATENT DOCUMENTS

| | | | |
|---|---|---|---|
| 5,886,937 A | 3/1999 | Jang | |
| 6,396,754 B1 | 5/2002 | Lee et al. | |
| 2002/0101774 A1 | 8/2002 | Nakamura et al. | |
| 2002/0191473 A1* | 12/2002 | Lee et al. | 365/230.03 |
| 2003/0031066 A1* | 2/2003 | Yanagisawa et al. | 365/200 |
| 2008/0037309 A1 | 2/2008 | Makino | |
| 2009/0207642 A1* | 8/2009 | Shimano et al. | 365/72 |
| 2011/0069569 A1* | 3/2011 | Park et al. | 365/203 |
| 2011/0128764 A1* | 6/2011 | Hosoe et al. | 365/51 |

FOREIGN PATENT DOCUMENTS

| | | |
|---|---|---|
| JP | 2008-041188 | 2/2008 |
| KR | 10-20010005112 A | 1/2001 |
| KR | 1020080070492 A | 7/2008 |
| KR | 1020080089755 A | 10/2008 |
| KR | 10-20090059677 A | 6/2009 |
| KR | 1020090059677 A | 6/2009 |
| KR | 1020090060602 A | 6/2009 |

* cited by examiner

*Primary Examiner* — Tuan T. Nguyen
(74) *Attorney, Agent, or Firm* — William Park & Associates Patent Ltd.

(57) ABSTRACT

A semiconductor apparatus includes: odd and even sub word line driving units configured to selectively drive odd sub word lines and even sub word lines among a plurality of sub word lines; a bit line sense amplifier including a plurality of sense amplifier driving lines which are electrically connected with bit lines; a first sense amplifier driving unit formed on one side of the bit line sense amplifier which extends in the same direction as the bit lines, and configured to drive odd sense amplifier driving lines among the plurality of sense amplifier driving lines; and a second sense amplifier driving unit formed on another side of the bit line sense amplifier which extends in the same direction as the bit lines, and configured to drive even sense amplifier driving lines among the plurality of sense amplifier driving lines according to driving of the even sub word lines.

41 Claims, 7 Drawing Sheets

SEMICONDUCTOR APPARATUS

CROSS-REFERENCES TO RELATED APPLICATION

The present application claims priority under 35 U.S.C. §119(a) to Korean Application No. 10-2010-0095627, filed on Sep. 30, 2010, in the Korean Intellectual Property Office, which is incorporated herein by reference in its entirety as if set forth in full.

BACKGROUND

1. Technical Field

The present invention relates to a semiconductor integrated circuit, and more particularly, to a semiconductor apparatus.

2. Related Art

In general, as the capacity of a DRAM (dynamic random access memory) increases, the resistance of lines increases, and thus, it becomes necessary to optimize delay time by appropriately controlling the lengths of the lines. To this end, word lines for selecting rows of a memory cell array are appropriately controlled. Thus, in a contemporary semiconductor memory apparatus, a hierarchical word line driving mechanism has been adopted, in which word lines are controlled to have appropriate lengths to form sub word lines.

To this end, word lines are made from a plurality of main word lines and a plurality of sub word lines which are coupled in common to each main word line. The sub word lines are coupled respectively to a mat which includes a plurality of memory cells.

Usually only a single sub word line is activated by an address, and an even word line driver and an odd word line driver are respectively disposed on both sides of a cell array (hereinafter referred to as a "mat").

A sub word line signal, which is activated by each sub word line driver, activates a plurality of memory cells, and a voltage difference (hereinafter referred to as "charge sharing") is induced between a bit line and a bit line bar. A bit line sense amplifier senses and amplifies the induced voltage difference in response to a sense amplifier enable signal, by which a data read operation is performed.

For example, assuming that an odd sub word line is activated, charge sharing between a bit line and a bit line bar occurs early near an odd word line driver and later near an even word line driver.

In a semiconductor apparatus, since the sense amplifier enable signal should be activated so as to cover where the charge sharing occurs latest to activate the bit line sense amplifier, the sense amplifier enable signal is delayed due to resistive and capacitive components of a metal line.

When a sense amplifier enable signal is activated at the same time on both sides of the mat, sense amplifiers in the middle region of the mat operate latest.

In the conventional semiconductor apparatus, charge sharing by word lines occurs latest near the even and odd word line drivers, that is, on both sides of the mat, and sense amplifiers in the middle region of the mat operate latest. Thus, data is sensed latest in the middle region of the mat.

Accordingly, in the conventional semiconductor apparatus, limitations exist in increasing a data processing speed.

SUMMARY

A semiconductor apparatus which is capable of increasing a data processing speed is described herein.

According to one aspect of the present invention, a semiconductor apparatus includes: odd and even sub word line driving units configured to selectively drive odd sub word lines and even sub word lines among a plurality of sub word lines; a bit line sense amplifier including a plurality of sense amplifier driving lines which are electrically connected with bit lines; a first sense amplifier driving unit formed on one side of the bit line sense amplifier which extends in the same direction as the bit lines, and configured to drive odd sense amplifier driving lines among the plurality of sense amplifier driving lines; and a second sense amplifier driving unit formed on another side of the bit line sense amplifier which extends in the same direction as the bit lines, and configured to drive even sense amplifier driving lines among the plurality of sense amplifier driving lines according to the driving of the even sub word lines.

According to another aspect of the present invention, a semiconductor apparatus includes: a mat including a plurality of word lines and a plurality of bit lines which are disposed to cross each other, are coupled to each other; a bit line sense amplifier configured to sense and amplify voltage differences between the bit lines and bit line bars in response to a sense amplifier enable signal which is applied from outside, and read data of corresponding cells in the mat; a first sense amplifier driving unit configured to logically combine even sub word line enable signals among sub word line enable signals, which are inputted from outside, and the sense amplifier enable signal, and output an even sense amplifier driving signal; and a second sense amplifier driving unit configured to logically combine odd sub word line enable signals among the sub word line enable signals and the sense amplifier enable signal, and output an odd sense amplifier driving signal.

According to still another aspect of the present invention, a semiconductor apparatus includes: a first sense amplifier driving signal control section configured to logically combine even row sub word line enable signals and a sense amplifier enable signal, and generate an even row sense amplifier signal; a first sense amplifier driving signal generation section configured to generate an even row sense amplifier driving signal in response to a level of the even row sense amplifier signal; a second sense amplifier driving signal control section configured to logically combine odd row sub word line enable signals and the sense amplifier enable signal, and generate an odd row sense amplifier signal; and a second sense amplifier driving signal generation section configured to generate an odd row sense amplifier driving signal in response to a level of the odd row sense amplifier signal.

According to still another aspect of the present invention, a semiconductor apparatus includes: a mat configured such that a plurality of word lines and a plurality of bit lines cross each other and are coupled to each other, and including a plurality of memory cells; a sub word line driving unit configured to selectively drive odd sub word lines or even sub word lines among the plurality of word lines; a bit line sense amplifier configured to sense and amplify voltage differences between the bit lines and bit line bars in response to a sense amplifier enable signal which is applied from outside, and perform operations of reading data of corresponding memory cells; and a sense amplifier driving unit configured to generate and output an even sense amplifier driving signal or an odd sense amplifier driving signal in correspondence to a direction in which the even sub word lines or the odd sub word lines are driven.

According to still another embodiment of the present invention, a semiconductor apparatus includes: a mat configured such that a plurality of word lines and a plurality of bit lines cross each other and are coupled with each other, and including a plurality of memory cells; a sub word line driving unit configured to selectively drive odd sub word lines or even sub word lines among the plurality of word lines; a bit line sense amplifier configured to sense and amplify voltage differences between the bit lines and bit line bars in response to a sense amplifier enable signal which is applied from an outside, and perform operations of reading data of corresponding memory cells; and a sense amplifier driving unit configured to generate and output an even sense amplifier driving signal or an odd sense amplifier driving signal in correspondence to a direction in which the even sub word lines or the odd sub word lines are driven.

According to still another embodiment of the present invention, a semiconductor apparatus includes: a bit line sense amplifier configured to amplify voltage differences between bit lines of a first mat and bit lines of a second mat in response to an even sense amplifier driving signal or an odd sense amplifier driving signal, and read data of the first mat or the second mat; a first sense amplifier driving unit configured to combine a combination signal of even sub word line enable signals among sub word line enable signals and a sense amplifier enable signal, and output the even sense amplifier driving signal; and a second sense amplifier driving unit configured to combine a combination signal of odd sub word line enable signals among the sub word line enable signals and the sense amplifier enable signal, and output the odd sense amplifier driving signal.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 1:
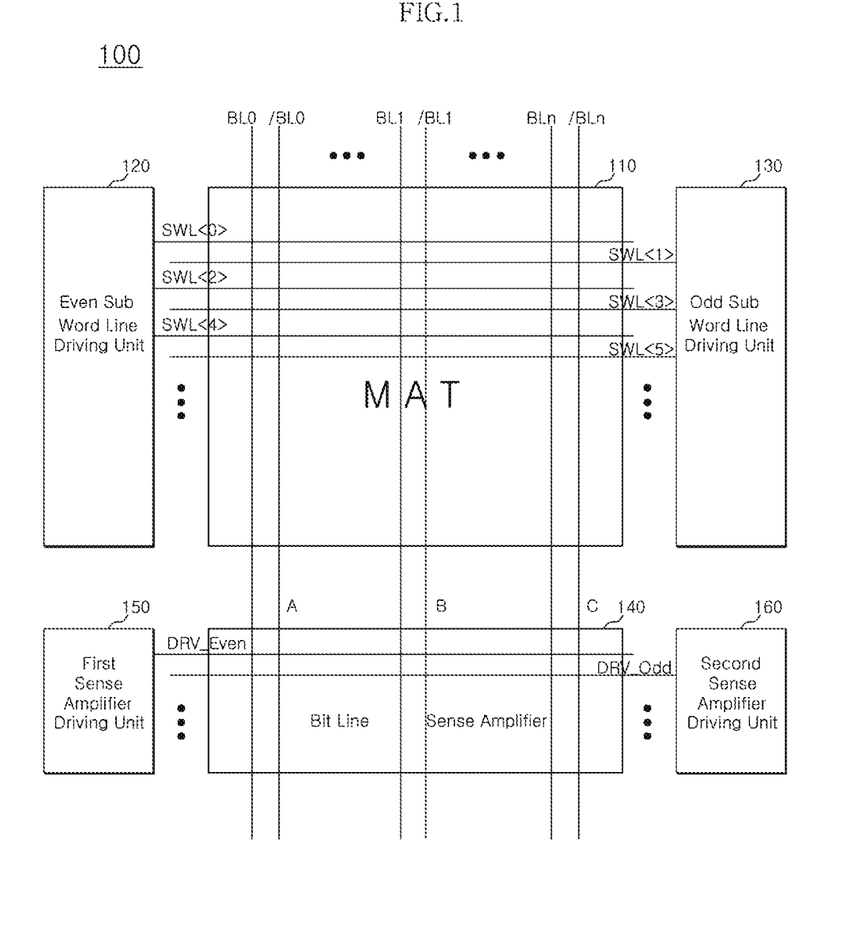
FIG. 1 is a block diagram illustrating a semiconductor apparatus in accordance with one embodiment of the present invention.

FIG. 1 is a block diagram illustrating a semiconductor apparatus in accordance with one embodiment of the present invention.

Referring to FIG. 1, a semiconductor apparatus 100 in accordance with the embodiment includes a mat 110, an even sub word line driving unit 120, an odd sub word line driving unit 130, a bit line sense amplifier 140, a first sense amplifier driving unit 150, and a second sense amplifier driving unit 160.

The mat 110 includes a memory cell array and is constituted in such a manner that a plurality of sub word lines SWL<0> through SWL<5> and a plurality of bit lines BL0 through BLn and /BL0 through /BLn cross each other.

In particular, the mat 110 has the plurality of sub word lines SWL<0> through SWL<5> which extend in a transverse direction. Such sub word lines SWL<0> through SWL<5> may include a plurality of even sub word lines SWL<0>, SWL<2> and SWL<4> which are controlled by a first main word line MWLB<0> and a plurality of odd sub word lines SWL<1>, SWL<3> and SWL<5> which are controlled by a second main word line MWLB<1>.

The even sub word line driving unit 120 is disposed on one side of the mat 110 which is parallel to a direction in which the plurality of bit lines BL0 through BLn and /BL0 through /BLn extend. The even sub word line driving unit 120 may activate the plurality of even sub word lines SWL<0>, SWL<2> and SWL<4>.

The odd sub word line driving unit 130 is disposed on another side of the mat 110 which is parallel to the direction in which the plurality of bit lines BL0 through BLn and /BL0 through /BLn extend. The odd sub word line driving unit 130 may activate the plurality of odd sub word lines SWL<1>, SWL<3> and SWL<5> among the plurality of sub word lines.

The bit line sense amplifier 140 is formed on another side of the mat 110 which is parallel to a direction in which the plurality of sub word lines SWL<0> through SWL<5> extend, and includes a plurality of sense amplifier driving lines (not shown) which are electrically coupled to the bit lines BL0 through BLn and /BL0 through /BLn.

Such a bit line sense amplifier 140 senses and amplifies a voltage difference between the bit line BL0 to BLn and the bit line bar /BL0 to /BLn in response to a sense amplifier enable signal, by which a data reading operation for a corresponding memory cell may be performed.

The first sense amplifier driving unit 150 is formed on one side of the bit line sense amplifier 140 which is parallel to the direction in which the plurality of bit lines BL0 through BLn and /BL0 through /BLn extend, and may generate an even sense amplifier driving signal DRV_Even to drive even sense amplifier driving lines among the plurality of sense amplifier driving lines, depending upon whether or not the even sub word lines SWL<0>, SWL<2> and SWL<4> are driven.

Figure 2:
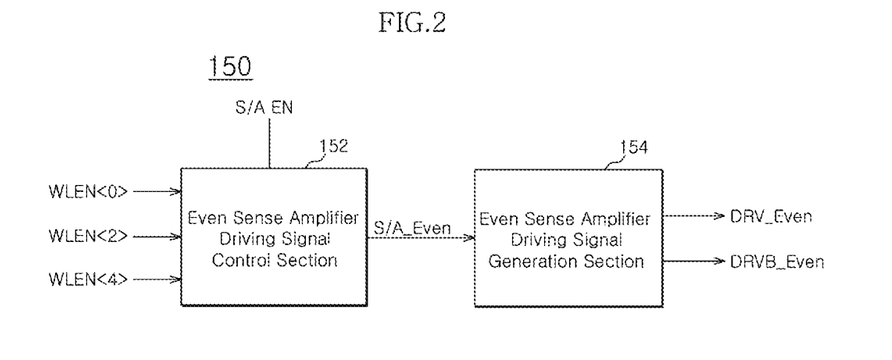
FIG. 2 is a detailed block diagram illustrating a first sense amplifier driving unit of the semiconductor apparatus in accordance with the embodiment of the present invention.

FIG. 2 is a detailed block diagram illustrating a first sense amplifier driving unit of the semiconductor apparatus in accordance with the embodiment of the present invention. As shown in FIG. 2, the first sense amplifier driving unit 150 includes an even sense amplifier driving signal control section 152 and an even sense amplifier driving signal generation section 154.

The even sense amplifier driving signal control section 152 is configured to logically combine even sub word line enable signals WLEN<0>, WLEN<2> and WLEN<4> and a sense amplifier enable signal S/A_EN, and generate a preliminary even sense amplifier signal S/A_Even.

The even sense amplifier driving signal generation section 154 is configured to generate the even sense amplifier driving signal DRV_Even in response to the level of the preliminary even sense amplifier signal S/A_Even.

The second sense amplifier driving unit 160 is formed on another side of the bit line sense amplifier 140 which is parallel to the direction in which the plurality of bit lines BL0 through BLn and /BL0 through /BLn extend, and may generate an odd sense amplifier driving signal DRV_Odd to drive odd sense amplifier driving lines among the plurality of sense amplifier driving lines, depending upon whether or not the odd sub word lines SWL<1>, SWL<3> and SWL<5> are driven.

Figure 3:
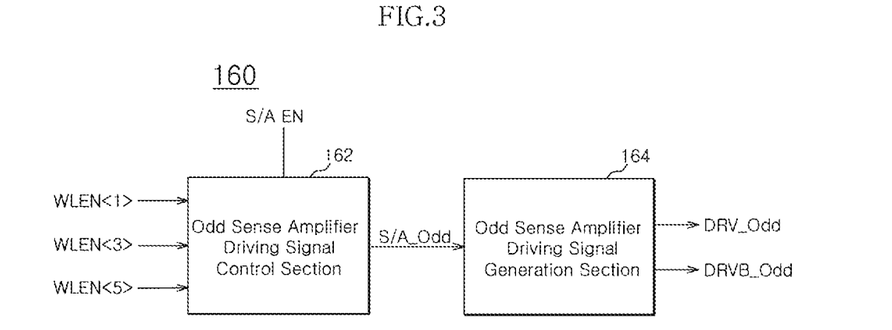
FIG. 3 is a detailed block diagram illustrating a second sense amplifier driving unit of the semiconductor apparatus in accordance with the embodiment of the present invention.

FIG. 3 is a detailed block diagram illustrating a second sense amplifier driving unit of the semiconductor apparatus in accordance with the embodiment of the present invention. As shown in FIG. 3, the second sense amplifier driving unit 160 includes an odd sense amplifier driving signal control section 162 and an odd sense amplifier driving signal generation section 164.

The odd sense amplifier driving signal control section 162 is configured to logically combine odd sub word line enable signals WLEN<1>, WLEN<3> and WLEN<5> and the sense amplifier enable signal S/A_EN, and generate a preliminary odd sense amplifier signal S/A_Odd.

The odd sense amplifier driving signal generation section 164 is configured to generate the odd sense amplifier driving signal DRV_Odd in response to the level of the preliminary odd sense amplifier signal S/A_Odd.

For example, in the semiconductor apparatus in accordance with the embodiment, assuming that the first sub word line SWL<0> is activated, charge sharing of the bit lines BL0 through BLn and the bit line bars /BL0 through /BLn occurs earliest near a region A which is closest to the even sub word line driving unit 120 and latest near a region C which is closest to the odd sub word line driving unit 130.

In the semiconductor apparatus in accordance with the embodiment, in order to activate the sense amplifier enable signal in conformity with timing of the region C where the charge sharing occurs latest, the first sense amplifier driving unit 150 is controlled first to generate the even sense amplifier driving signal DRV_Even so that the bit line sense amplifier may be driven earliest in the region A and latest in the region C, whereby it is possible to increase a data processing speed.

Figure 4:
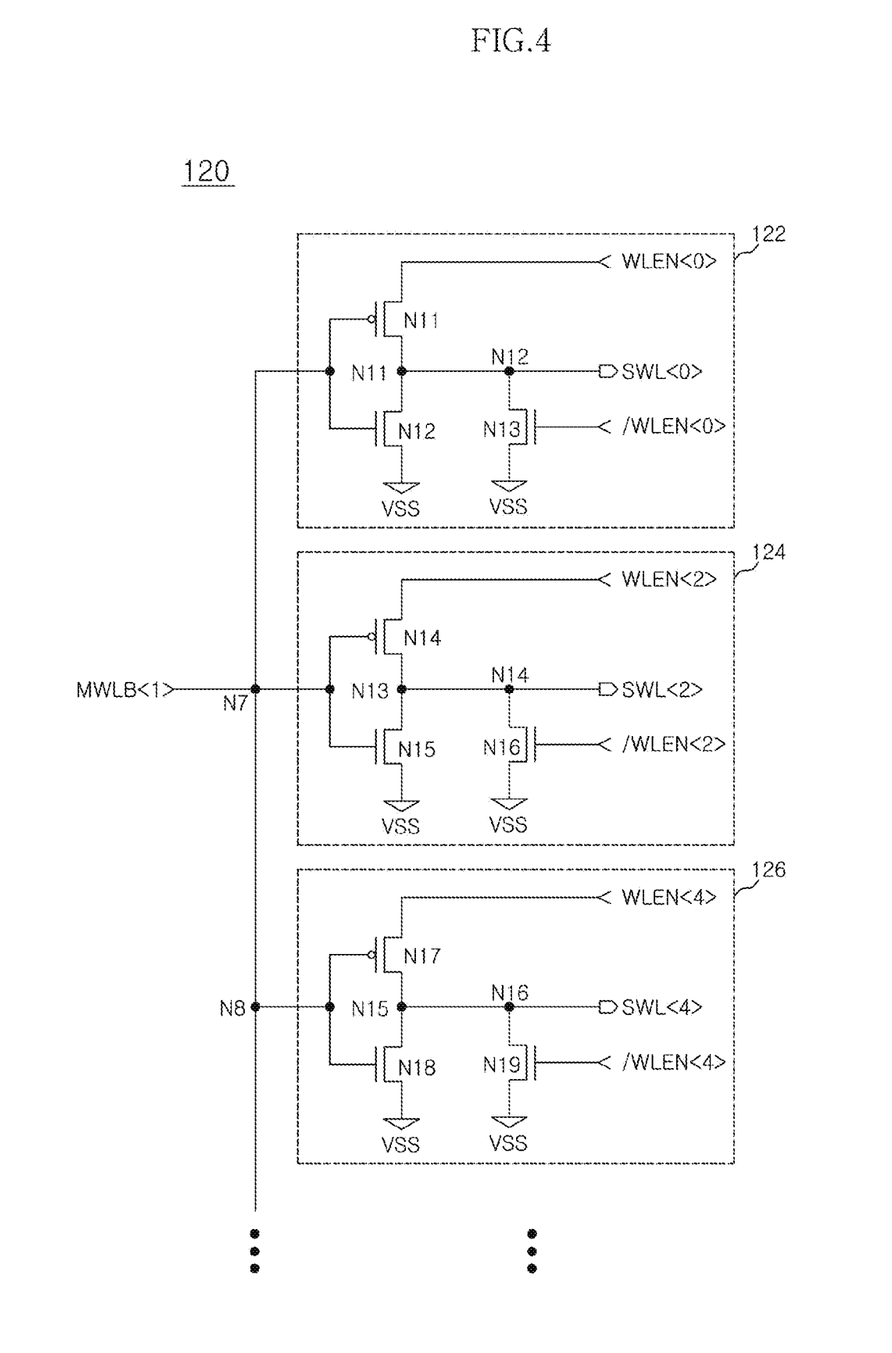
FIG. 4 is a detailed circuit diagram illustrating an even sub word line driving unit of the semiconductor apparatus in accordance with the embodiment of the present invention.

FIG. 4 is a detailed circuit diagram illustrating the even sub word line driving unit of the semiconductor apparatus in accordance with the embodiment of the present invention.

Referring to FIG. 4, the even sub word line driving unit 120 of the semiconductor apparatus in accordance with the embodiment includes a plurality of even word line driving sections 122, 124 and 126. With reference to FIG. 4, only three even word line driving sections will be described in the embodiment for the sake of convenience in explanation.

A first even word line driving section 122 is configured to activate the first sub word line SWL<0> in response to the level of the first main word line MWLB<0> and a first sub word line enable signal WLEN<0>.

In detail, the first even word line driving section 122 includes a first transistor T11 which activates the first sub word line SWL<0> according to the level of the first sub word line enable signal WLEN<0> in response to a low level of the first main word line MWLB<0>, a second transistor T12 which deactivates the first sub word line SWL<0> in response a high level of the first main word line MWLB<0>, and a third transistor T13 which deactivates the first sub word line SWL<0> when a low level of the first sub word line enable signal WLEN<0> is inputted.

Describing the driving of the first even word line driving section 122, if the high level of the first main word line MWLB<0> is inputted through a node N17, the first transistor T11 is turned off and the second transistor T12 is turned on, and because the level value of a first node N11 becomes low, a low level is outputted to the first sub word line SWL<0>.

Conversely, in the first even word line driving section 122, if the low level of the first main word line MWLB<0> is inputted through the node N17, the second transistor T12 is turned off and the first transistor T11 is turned on, and a high level can be outputted to the first sub word line SWL<0> according to the level of the first sub word line enable signal WLEN<0>. In this regard, the first even word line driving section 122 may make the first sub word line SWL<0> have the high level only when the first sub word line enable signal WLEN<0> is in a high level period. If the first sub word line enable signal WLEN<0> has the low level, since the third transistor T13 is turned on and accordingly the voltage level of a second node N12 becomes low, the first even word line driving section 122 may make the first sub word line SWL<0> have the low level.

A second even word line driving section 124 is configured to activate the third sub word line SWL<2> in response to the level of the first main word line MWLB<0> and a third sub word line enable signal WLEN<2>.

In detail, the second even word line driving section 124 includes a fourth transistor T14 which activates the third sub word line SWL<2> according to the level of the third sub word line enable signal WLEN<2> in response to the low level of the first main word line MWLB<0>, a fifth transistor T15 which deactivates the third sub word line SWL<2> in response the high level of the first main word line MWLB<0>, and a sixth transistor T16 which deactivates the third sub word line SWL<2> when a low level of the third sub word line enable signal WLEN<2> is inputted.

Describing the driving of the second even word line driving section 124, if the high level of the first main word line MWLB<0> is inputted through the node N17, the fourth transistor T14 is turned off and the fifth transistor T15 is turned on, and because the level value of a third node N13 becomes low, the third sub word line SWL<2> can be made to have a low level.

Conversely, in the second even word line driving section 124, if the low level of the first main word line MWLB<0> is inputted through the node N17, the fifth transistor T15 is turned off and the fourth transistor T14 is turned on, and the third sub word line SWL<2> can be made to have a high level according to the level of the third sub word line enable signal WLEN<2>. In this regard, the second even word line driving section 124 may make the third sub word line SWL<2> have the high level only when the third sub word line enable signal WLEN<2> is in a high level period. If the third sub word line enable signal WLEN<2> has the low level, since the sixth transistor T16 is turned on and accordingly the voltage level of a fourth node N14 becomes low, the second even word line driving section 124 may make the third sub word line SWL<2> have the low level.

A third even word line driving section 126 is configured to activate the fifth sub word line SWL<4> in response to the level of the first main word line MWLB<0> and a fifth sub word line enable signal WLEN<4>.

In detail, the third even word line driving section 126 includes a seventh transistor T17 which activates the fifth sub word line SWL<4> according to the level of the fifth sub word line enable signal WLEN<4> in response to the low level of the first main word line MWLB<0>, an eighth transistor T18 which deactivates the fifth sub word line SWL<4> in response the high level of the first main word line MWLB<0>, and a ninth transistor T19 which deactivates the fifth sub word line SWL<4> when a low level of the fifth sub word line enable signal WLEN<4> is inputted.

Describing the driving of the third even word line driving section 126, if the high level of the first main word line MWLB<0> is inputted through the node N17, the seventh transistor T17 is turned off and the eighth transistor T18 is turned on, and because the level value of a fifth node N15 becomes low, the fifth sub word line SWL<4> can be made to have a low level.

Conversely, in the third even word line driving section 126, if the low level of the first main word line MWLB<0> is inputted through the node N17, the eighth transistor T18 is turned off and the seventh transistor T17 is turned on, and the fifth sub word line SWL<4> can be made to have a high level according to the level of the fifth sub word line enable signal WLEN<4>. In this regard, the third even word line driving section 126 may make the fifth sub word line SWL<4> have the high level only when the fifth sub word line enable signal WLEN<4> is in a high level period. If the fifth sub word line enable signal WLEN<4> has the low level, since the ninth transistor T19 is turned on and accordingly the voltage level of a sixth node N16 becomes low, the third even word line driving section 126 may make the fifth sub word line SWL<4> have the low level.

As such, in the semiconductor apparatus in accordance with the embodiment of the present invention, due to the fact that the even sub word line driving unit 120 may activate only corresponding even rows, that is, the even sub word lines based on the level of the main word line and the respective sub word line enable signals, interference with adjoining odd rows, that is, the odd sub word lines can be prevented.

Figure 5:
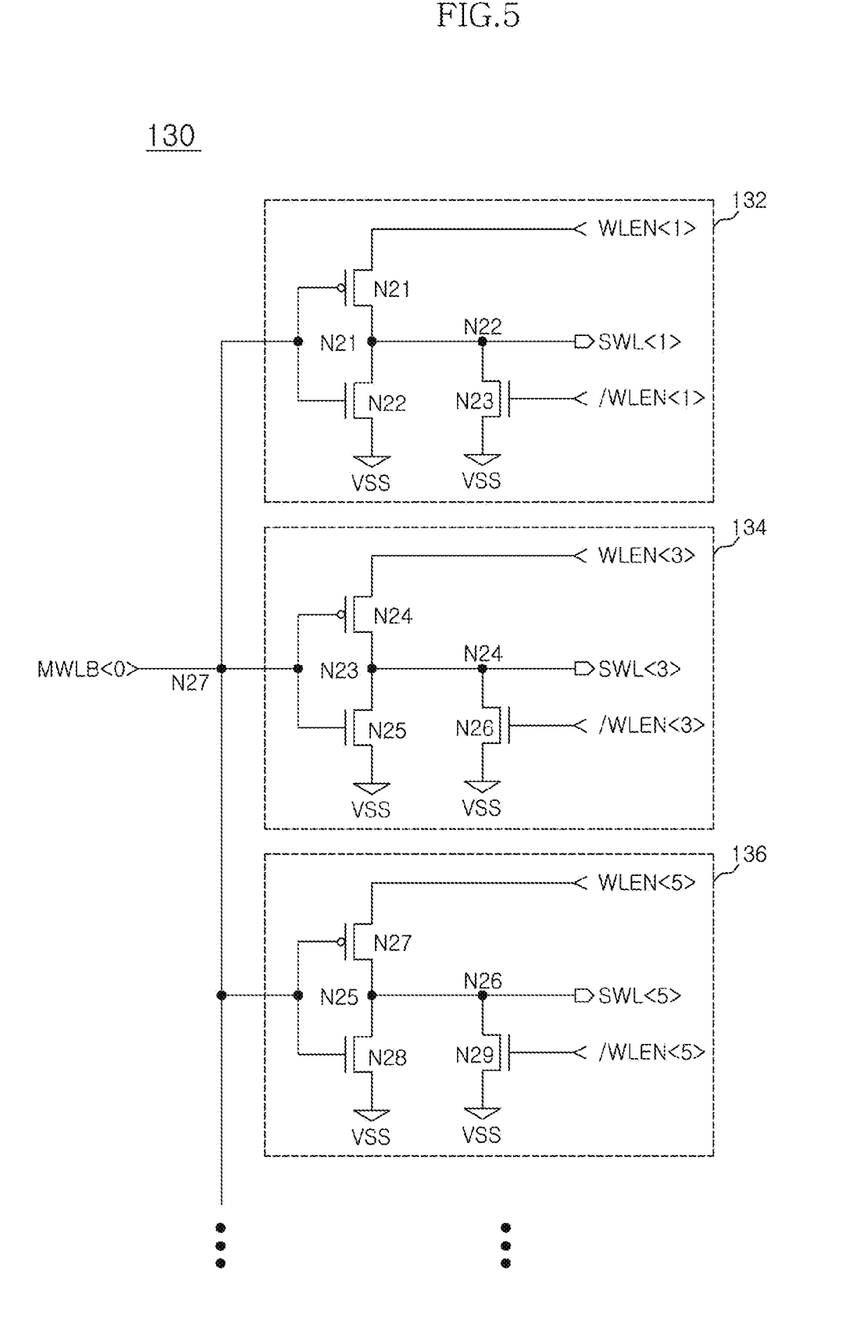
FIG. 5 is a detailed circuit diagram illustrating an odd sub word line driving unit of the semiconductor apparatus in accordance with the embodiment of the present invention.

FIG. 5 is a detailed circuit diagram illustrating the odd sub word line driving unit of the semiconductor apparatus in accordance with the embodiment of the present invention.

Referring to FIG. 5, the odd sub word line driving unit 130 of the semiconductor apparatus in accordance with the embodiment includes a plurality of odd word line driving sections 132, 134 and 136. With reference to FIG. 5, only three odd word line driving sections will be described in the embodiment of the present invention for the sake of convenience in explanation.

A first odd word line driving section 132 is configured to activate the second sub word line SWL<1> in response to the level of the second main word line MWLB<1> and a second sub word line enable signal WLEN<1>.

In detail, the first odd word line driving section 132 includes a first transistor T21 which activates the second sub word line SWL<1> according to the level of the second sub word line enable signal WLEN<1> in response to a low level of the second main word line MWLB<1>, a second transistor T22 which deactivates the second sub word line SWL<1> in response a high level of the second main word line MWLB<1>, and a third transistor T23 which deactivates the second sub word line SWL<1> when the second sub word line enable signal WLEN<1> is deactivated.

Describing the driving of the first odd word line driving section 132, if the high level of the second main word line MWLB<1> is inputted through a node N27, the first transistor T21 is turned off and the second transistor T22 is turned on, and because the level value of a first node N21 becomes low, the second sub word line SWL<1> can be made to have a low level.

Conversely, in the first odd word line driving section 132, if the low level of the second main word line MWLB<1> is inputted through the node N27, the second transistor T22 is turned off and the first transistor T21 is turned on, and a high level can be outputted to the second sub word line SWL<1> according to the level of the second sub word line enable signal WLEN<1>. In this regard, the first odd word line driving section 132 may make the second sub word line SWL<1> have the high level only when the second sub word line enable signal WLEN<1> is in a high level period. If the second sub word line enable signal WLEN<1> has a low level, since the third transistor T23 is turned on and accordingly the voltage level of a second node N22 becomes low, the first odd word line driving section 132 may make the second sub word line SWL<1> have the low level.

A second odd word line driving section 134 is configured to activate the fourth sub word line SWL<3> in response to the level of the second main word line MWLB<1> and a fourth sub word line enable signal WLEN<3>.

In detail, the second odd word line driving section 134 includes a fourth transistor T24 which activates the fourth sub word line SWL<3> according to the level of the fourth sub word line enable signal WLEN<3> in response to the low level of the second main word line MWLB<1>, a fifth transistor T25 which deactivates the fourth sub word line SWL<3> in response the high level of the second main word line MWLB<1>, and a sixth transistor T26 which deactivates the fourth sub word line SWL<3> when the fourth sub word line enable signal WLEN<3> is deactivated.

Describing the driving of the second odd word line driving section 134, if the high level of the second main word line MWLB<1> is inputted through the node N27, the fourth transistor T24 is turned off and the fifth transistor T25 is turned on, and because the level value of a third node N23 becomes low, the fourth sub word line SWL<3> can be made to have a low level.

Conversely, in the second odd word line driving section 134, if the low level of the second main word line MWLB<1> is inputted through the node N27, the fifth transistor T25 is turned off and the fourth transistor T24 is turned on, and a high level can be outputted to the fourth sub word line SWL<3> according to the level of the fourth sub word line enable signal WLEN<3>. In this regard, the second odd word line driving section 134 may make the fourth sub word line SWL<3> have the high level only when the fourth sub word line enable signal WLEN<3> is in a high level period. If the fourth sub word line enable signal WLEN<3> has a low level, since the sixth transistor T26 is turned on and accordingly the voltage level of a fourth node N24 becomes low, the second odd word line driving section 134 may make the fourth sub word line SWL<3> have the low level.

A third odd word line driving section 136 is configured to activate the sixth sub word line SWL<5> in response to the level of the second main word line MWLB<1> and a sixth sub word line enable signal WLEN<5>.

In detail, the third odd word line driving section 136 includes a seventh transistor T27 which activates the sixth sub word line SWL<5> according to the level of the sixth sub word line enable signal WLEN<5> in response to the low level of the second main word line MWLB<1>, an eighth transistor T28 which deactivates the sixth sub word line SWL<5> in response the high level of the second main word line MWLB<1>, and a ninth transistor T29 which deactivates the sixth sub word line SWL<5> when the sixth sub word line enable signal WLEN<5> is deactivated.

Describing the driving of the third odd word line driving section 136, if the high level of the second main word line MWLB<1> is inputted through the node N27, the seventh transistor T27 is turned off and the eighth transistor T28 is turned on, and because the level value of a fifth node N23 becomes low, the sixth sub word line SWL<5> can be made to have a low level.

Conversely, in the third odd word line driving section 136, if the low level of the second main word line MWLB<1> is inputted through the node N27, the eighth transistor T28 is turned off and the seventh transistor T27 is turned on, and a high level can be outputted to the sixth sub word line SWL<5> according to the level of the sixth sub word line enable signal WLEN<5>. In this regard, the third odd word line driving section 136 may make the sixth sub word line SWL<5> have the high level only when the sixth sub word line enable signal WLEN<5> is in a high level period. If the sixth sub word line enable signal WLEN<5> has a low level, since the ninth transistor T29 is turned on and accordingly the voltage level of a sixth node N26 becomes low, the third odd word line driving section 136 may make the sixth sub word line SWL<5> have the low level.

As such, in the semiconductor apparatus in accordance with the embodiment of the present invention, due to the fact that the odd sub word line driving unit 130 may activate only corresponding odd rows, that is, the odd sub word lines SWL<1>, SWL<3> and SWL<5> based on the level of the main word line and the respective sub word line enable signals, interference with adjoining even rows, that is, the even sub word lines can be prevented.

Figure 6:
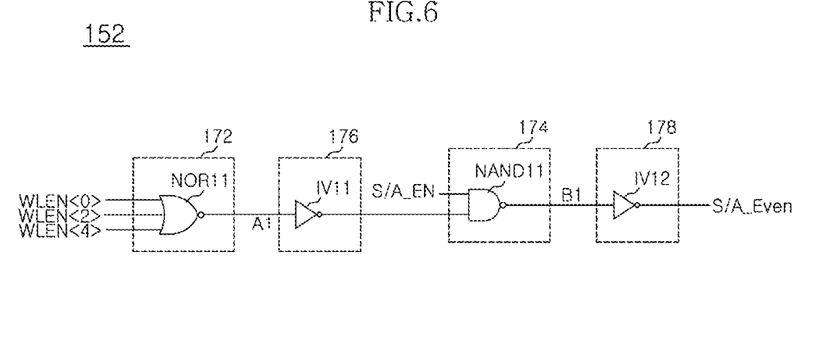
FIG. 6 is a detailed circuit diagram illustrating an even sense amplifier driving signal control section of the first sense amplifier driving unit shown in FIG. 2.

FIG. 6 is a detailed circuit diagram illustrating the even sense amplifier driving signal control section of the first sense amplifier driving unit shown in FIG. 2.

Referring to FIG. 6, the even sense amplifier driving signal control section 152 of the first sense amplifier driving unit 150 in accordance with the embodiment includes a first even combination stage 172, a second even combination stage 174, a first even inversion stage 176, and a second even inversion stage 178.

The first even combination stage 172 is configured to combine the even sub word line enable signals WLEN<0>, WLEN<2> and WLEN<4>, and may include, for example, a NOR gate NOR11.

The second even combination stage 174 is configured to combine an inverted signal of a combination signal A1 outputted from the first even combination stage 172 and the sense amplifier enable signal S/A_EN and output an output signal B1. An example of the second even combination stage 174 may include a NAND gate NAND11.

The first even inversion stage 176 is configured to output the inverted signal of the combination signal A1 outputted from the first even combination stage 172, to the second even combination stage 174. The first even inversion stage 176 may include, for example, an inverter IV11.

The second even inversion stage 178 is configured to invert a signal B1 outputted from the second even combination stage 174, generate the preliminary even sense amplifier signal S/A_Even, and output the preliminary even sense amplifier signal S/A_Even to the even sense amplifier driving signal generation unit 154. The second even inversion stage 178 may include, for example, an inverter IV12.

In detail, describing operations of the even sense amplifier driving signal control section 152, the first even combination stage 172 logically combines the first, third and fifth even sub word line enable signals WLEN<0>, WLEN<2> and WLEN<4> which are inputted from outside, and generates the combination signal A1. If all the first, third and fifth even sub word line enable signals WLEN<0>, WLEN<2> and WLEN<4> are inputted at low levels, the combination signal A1 of a high level is outputted, and if at least one of the first, third and fifth even sub word line enable signals WLEN<0>, WLEN<2> and WLEN<4> is inputted at a high level, the combination signal A1 of a low level is outputted.

The second even combination stage 174 generates the output signal B1 of a low level and outputs the output signal B1 to the second even inversion stage 178 if both the inverted signal of the combination signal A1 outputted from the first even combination stage 172 and the sense amplifier enable signal S/A_EN are inputted at high levels. Conversely, the second even combination stage 174 generates the output signal B1 of a high level and outputs the output signal B1 to the second even inversion stage 178 if at least any one of the inverted signal of the combination signal A1 outputted from the first even combination stage 172 and the sense amplifier enable signal S/A_EN is inputted at a low level.

If the combination signal A1 of a low level is applied from the first even combination stage 172, the first even inversion stage 176 inverts the combination signal A1 into a signal of a high level and outputs the resultant signal to the second even combination stage 174. Conversely, if the combination signal A1 of a high level is applied from the first even combination stage 172, the first even inversion stage 176 inverts the combination signal A1 into a signal of a low level and outputs the resultant signal to the second even combination stage 174.

If the output signal B1 of a high level is applied from the second even combination stage 174, the second even inversion stage 178 generates the preliminary even sense amplifier signal S/A_Even of a low level and outputs the preliminary even sense amplifier signal S/A_Even of the low level to the even sense amplifier driving signal generation stage 154. Conversely, if the output signal B1 of a low level is applied from the second even combination stage 174, the second even inversion stage 178 generates the preliminary even sense amplifier signal S/A_Even of a high level and outputs the preliminary even sense amplifier signal S/A_Even of the high level to the even sense amplifier driving signal generation stage 154.

As such, the even sense amplifier driving signal control section 152 in accordance with the embodiment is driven according to whether or not the even sub word line enable signals WLEN<0>, WLEN<2> and WLEN<4> are activated. If any one of the plurality of even sub word line enable signals WLEN<0>, WLEN<2> and WLEN<4> is activated, the preliminary even sense amplifier signal S/A_Even is activated as well, whereby a data processing speed can be increased.

Figure 7:
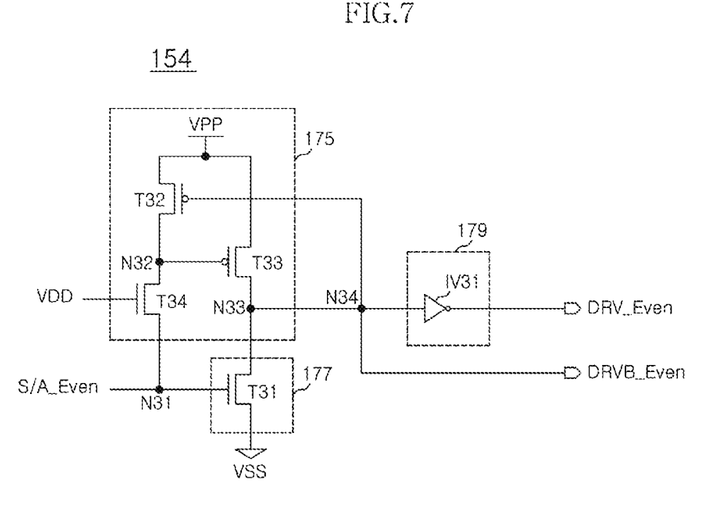
FIG. 7 is a detailed circuit diagram illustrating an even sense amplifier driving signal generation section of the first sense amplifier driving unit shown in FIG. 2.

FIG. 7 is a detailed circuit diagram illustrating the even sense amplifier driving signal generation section of the first sense amplifier driving unit shown in FIG. 2.

Referring to FIG. 7, the even sense amplifier driving signal generation section 154 of the first sense amplifier driving unit 150 in accordance with the embodiment is configured to receive the preliminary even sense amplifier signal S/A_Even applied from the even sense amplifier driving signal control section 152 and generate the even sense amplifier driving signal DRV_Even. The even sense amplifier driving signal generation section 154 includes an even switching stage 177, an even inversion stage 179, and an even reset stage 175.

The even switching stage 177 is configured to be turned on according to the level of the preliminary even sense amplifier signal S/A_Even, and may include, for example, an NMOS transistor T31.

The even inversion stage 179 is configured to receive a signal outputted from the even switching stage 177, generate the even sense amplifier driving signal DRV_Even and an even sense amplifier driving signal bar DRVB_Even, and output the even sense amplifier driving signal DRV_Even and the even sense amplifier driving signal bar DRVB_Even to the bit line sense amplifier 140. The even inversion stage 179 may include, for example, an inverter IV31.

Describing operations of the even sense amplifier driving signal generation section 154, the even switching stage 177 is activated when the preliminary even sense amplifier signal S/A_Even is inputted at the high level. The even inversion stage 179 generates and outputs the even sense amplifier driving signal DRV_Even and the even sense amplifier driving signal bar DRVB_Even based on the signal outputted from the even switching stage 177.

Conversely, the even switching stage 177 is deactivated when the preliminary even sense amplifier signal S/A_Even is inputted at the low level, and the even sense amplifier driving signal DRV_Even of a low level is outputted.

The even reset stage 175 may prevent the even sense amplifier driving signal DRV_Even from being driven by being floated when the preliminary even sense amplifier signal S/A_Even has the low level. The even reset stage 175 may be constituted by, for example, two PMOS transistors T32 and T33 and one NMOS transistor T34.

In the even reset stage 175, if the preliminary even sense amplifier signal S/A_Even of the low level is inputted through a first node N31, the level of a second node N32 becomes low and the second PMOS transistor T33 is activated. Accordingly, as the level of a third node N33 becomes high, the even sense amplifier driving signal DRV_Even is not activated.

Conversely, in the even reset stage 175, if the preliminary even sense amplifier signal S/A_Even of the high level is inputted through the first node N31, the level of a fourth node N34 becomes low and the first PMOS transistor T32 is activated. Accordingly, as the level of the first node N31 becomes high too, the even switching stage 177 can be kept activated.

As such, the even sense amplifier driving signal generation stage 154 in accordance with the embodiment is driven according to whether or not the even sub word line enable signals WLEN<0>, WLEN<2> and WLEN<4> are activated. If any one of the plurality of even sub word line enable signals WLEN<0>, WLEN<2> and WLEN<4> is activated, the even sense amplifier driving signal DRV_Even can be activated together, whereby a data processing speed can be increased.

Figure 8:
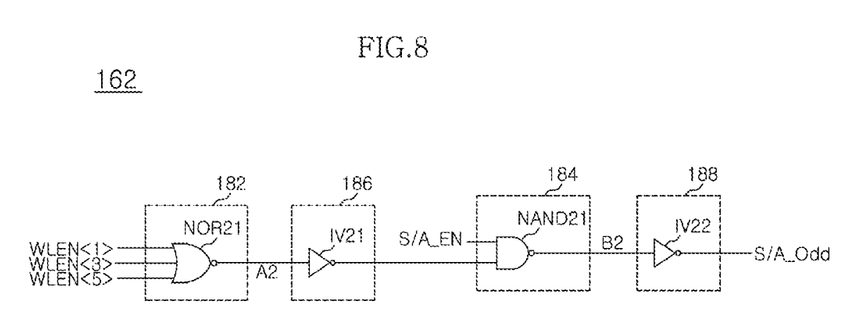
FIG. 8 is a detailed circuit diagram illustrating an odd sense amplifier driving signal control section of the second sense amplifier driving unit shown in FIG. 3.

FIG. 8 is a detailed circuit diagram illustrating an odd sense amplifier driving signal control section of the second sense amplifier driving unit shown in FIG. 3.

Referring to FIG. 8, the odd sense amplifier driving signal control section 162 of the second sense amplifier driving unit 160 in accordance with the embodiment includes a first odd combination stage 182, a second odd combination stage 184, a first odd inversion stage 186, and a second odd inversion stage 188.

The first odd combination stage 182 is configured to combine the odd sub word line enable signals WLEN<1>, WLEN<3> and WLEN<5>, and may include, for example, a NOR gate NOR21.

The second odd combination stage 184 is configured to combine a signal outputted from the first odd inversion stage 186 and the sense amplifier enable signal S/A_EN and output an output signal B2. An example of the second odd combination stage 184 may include a NAND gate NAND21.

The first odd inversion stage 186 is configured to invert a combination signal A2 outputted from the first odd combination stage 182 and output a resultant inverted signal to the second odd combination stage 184. The first odd inversion stage 186 may include, for example, an inverter IV21.

The second odd inversion stage 188 is configured to invert a signal B2 outputted from the second odd combination stage 184, generate the preliminary odd sense amplifier signal S/A_Odd, and output the preliminary odd sense amplifier signal S/A_Odd to the odd sense amplifier driving signal generation unit 164. The second odd inversion stage 188 may include, for example, an inverter IV22.

In detail, describing operations of the odd sense amplifier driving signal control section 162, the first odd combination stage 182 combines the second, fourth and sixth odd sub word line enable signals WLEN<1>, WLEN<3> and WLEN<5> which are inputted from outside, and generates the combination signal A2. If all the second, fourth and sixth odd sub word line enable signals WLEN<1>, WLEN<3> and WLEN<5> are inputted at low levels, the combination signal A2 of a high level is outputted, and if at least one of the second, fourth and sixth odd sub word line enable signals WLEN<1>, WLEN<3> and WLEN<5> is inputted at a high level, the combination signal A2 of a low level is outputted.

The second odd combination stage 184 generates the output signal B2 of a low level and outputs the output signal B2 to the second odd inversion stage 188 if both the inverted signal of the combination signal A2 outputted from the first odd combination stage 182 and the sense amplifier enable signal S/A_EN are inputted at high levels. Conversely, the second odd combination stage 184 generates the output signal B2 of a high level and outputs the output signal B2 to the second odd inversion stage 188 if at least any one of the inverted signal of the combination signal A2 outputted from the first odd combination stage 182 and the sense amplifier enable signal S/A_EN is inputted at a low level.

If the combination signal A2 of a low level is applied from the first odd combination stage 182, the first odd inversion stage 186 inverts the combination signal A2 into a signal of a high level and outputs the resultant signal to the second odd combination stage 184. Conversely, if the combination signal A2 of a high level is applied from the first odd combination stage 182, the first odd inversion stage 186 inverts the combination signal A2 into a signal of a low level and outputs the resultant signal to the second odd combination stage 184.

If the output signal B2 of a high level is applied from the second odd combination stage 184, the second odd inversion stage 188 generates the preliminary odd sense amplifier signal S/A_Odd of a low level and outputs the preliminary odd sense amplifier signal S/A_Odd of the low level to the odd sense amplifier driving signal generation stage 164. Conversely, if the output signal B2 of a low level is applied from the second odd combination stage 184, the second odd inversion stage 188 generates the preliminary odd sense amplifier signal S/A_Odd of a high level and outputs the preliminary odd sense amplifier signal S/A_Odd of the high level to the odd sense amplifier driving signal generation stage 164.

As such, the odd sense amplifier driving signal control section 162 in accordance with the embodiment is driven according to whether or not the odd sub word line enable signals WLEN<1>, WLEN<3> and WLEN<5> are activated. If any one of the plurality of odd sub word line enable signals WLEN<1>, WLEN<3> and WLEN<5> is activated, the preliminary odd sense amplifier signal S/A_Odd is activated as well, whereby a data processing speed can be increased.

Figure 9:
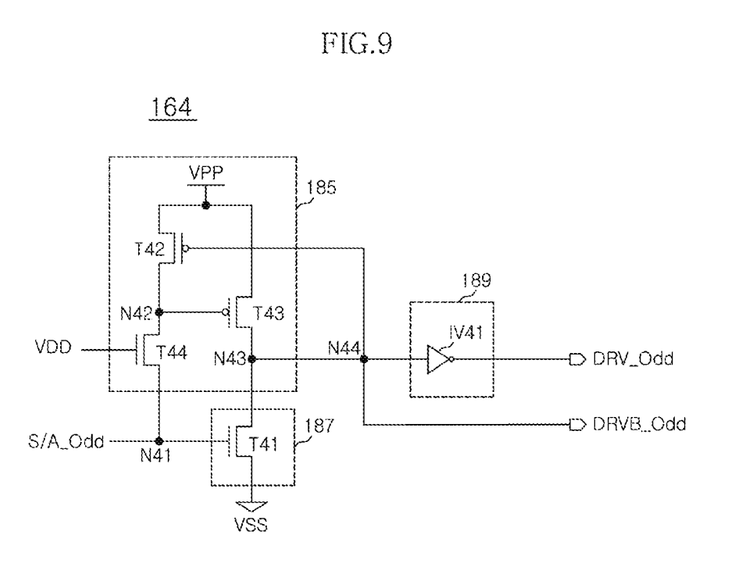
FIG. 9 is a detailed circuit diagram illustrating an odd sense amplifier driving signal generation section of the second sense amplifier driving unit shown in FIG. 3.

FIG. 9 is a detailed circuit diagram illustrating an odd sense amplifier driving signal generation section of the second sense amplifier driving unit shown in FIG. 3.

Referring to FIG. 9, the odd sense amplifier driving signal generation section 164 of the second sense amplifier driving unit 160 in accordance with the embodiment is configured to receive the preliminary odd sense amplifier signal S/A_Odd applied from the odd sense amplifier driving signal control section 162 and generate the odd sense amplifier driving signal DRV_Odd. The odd sense amplifier driving signal generation section 164 includes an odd switching stage 187, an odd inversion stage 189, and an odd reset stage 185.

The odd switching stage 187 is configured to be turned on according to the level of the preliminary odd sense amplifier signal S/A_Odd, and may include, for example, an NMOS transistor T41.

The odd inversion stage 189 is configured to receive a signal outputted from the odd switching stage 187, generate the odd sense amplifier driving signal DRV_Odd and an odd sense amplifier driving signal bar DRVB_Odd, and output the odd sense amplifier driving signal DRV_Odd and the odd sense amplifier driving signal bar DRVB_Odd to the bit line sense amplifier 140. The odd inversion stage 189 may include, for example, an inverter IV41.

Describing operations of the odd sense amplifier driving signal generation section 164, the odd switching stage 187 is activated when the preliminary odd sense amplifier signal S/A_Odd is inputted at the high level. The odd inversion stage 189 generates and outputs the odd sense amplifier driving signal DRV_Odd and the odd sense amplifier driving signal bar DRVB_Odd based on the signal outputted from the odd switching stage 187.

Conversely, the odd switching stage 187 is deactivated when the preliminary odd sense amplifier signal S/A_Odd is inputted at the low level, and the odd sense amplifier driving signal DRV_Odd of a low level is outputted.

The odd reset stage 185 may prevent the odd sense amplifier driving signal DRV_Odd from being driven by being floated when the preliminary odd sense amplifier signal S/A_Odd has the low level. The odd reset stage 185 may be constituted by, for example, two PMOS transistors T42 and T43 and one NMOS transistor T44.

In the odd reset stage 185, if the preliminary odd sense amplifier signal S/A_Odd of the low level is inputted through a first node N41, the level of a second node N42 becomes low and the second PMOS transistor T43 is activated. Accordingly, as the level of a third node N43 becomes high, the odd sense amplifier driving signal DRV_Odd is reset.

Conversely, in the odd reset stage 185, if the preliminary odd sense amplifier signal S/A_Odd of the high level is inputted through the first node N41, the level of a fourth node N44 becomes low and the first PMOS transistor T42 is activated. Accordingly, as the level of the first node N41 becomes high too, the odd switching stage 187 can be kept activated.

As such, the odd sense amplifier driving signal generation stage 164 in accordance with the embodiment is driven according to whether or not the odd sub word line enable signals WLEN<1>, WLEN<3> and WLEN<5> are activated. If any one of the plurality of odd sub word line enable signals WLEN<1>, WLEN<3> and WLEN<5> is activated, the odd sense amplifier driving signal DRV_Odd can be activated together, whereby a data processing speed can be increased.

Figure 10:
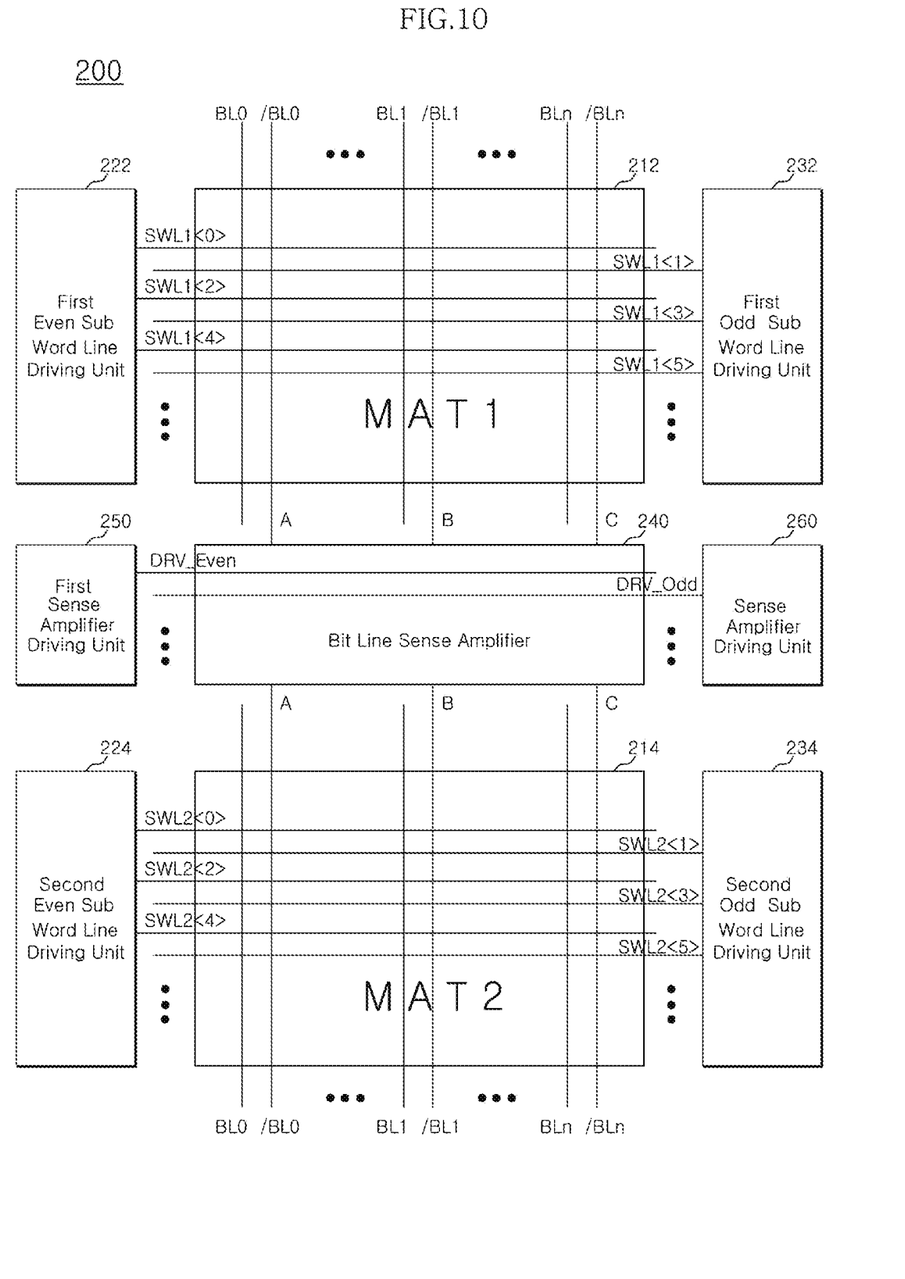
FIG. 10 is a block diagram illustrating a semiconductor apparatus in accordance with another embodiment of the present invention.

FIG. 10 is a block diagram illustrating a semiconductor apparatus in accordance with another embodiment of the present invention.

Referring to FIG. 10, a semiconductor apparatus 200 in accordance with another embodiment of the present invention includes a plurality of mats 212 and 214, a plurality of even sub word line driving units 222 and 224, a plurality of odd sub word line driving units 232 and 234, a bit line sense amplifier 240, a first sense amplifier driving unit 250, and a second sense amplifier driving unit 260.

The plurality of mats 212 and 214 serve as memory cell arrays. In each of the plurality of mats 212 and 214, a plurality of sub word lines SWL<0> through SWL<5> and a plurality of bit lines BL0 through BLn and /BL0 through /BLn are disposed to cross each other. The plurality of mats 212 and 214 are arranged to face each other with the bit line sense amplifier 240 interposed therebetween.

In particular, each of the plurality of mats 212 and 214 includes a plurality of sub word lines SWL<0> through SWL<5> which are disposed in the transverse direction. These sub word lines SWL<0> through SWL<5> can include a plurality of even sub word lines SWL<0>, SWL<2> and SWL<4> which are controlled by a first main word line and a plurality of odd sub word lines SWL<1>, SWL<3> and SWL<5> which are controlled by a second main word line.

Further, each of the plurality of mats 212 and 214 includes the plurality of bit lines BL0 through BLn and /BL0 through /BLn which are disposed in the longitudinal direction.

For example, the plurality of even sub word line driving units 222 and 224 may be configured to include first and second even sub word line driving units 222 and 224.

The first even sub word line driving unit 222 is disposed on one side of the first mat 212 among the plurality of mats, which is parallel to a direction in which the plurality of bit lines BL0 through BLn and /BL0 through /BLn extend. The first even sub word line driving unit 222 may activate the plurality of even sub word lines SWL<0>, SWL<2> and SWL<4> which are formed in the first mat 212.

The second even sub word line driving unit 224 is disposed on one side of the second mat 214 among the plurality of mats. The second even sub word line driving unit 224 may activate the plurality of even sub word lines SWL<0>, SWL<2> and SWL<4> which are formed in the second mat 214.

For example, the plurality of odd sub word line driving units 232 and 234 may be configured to include first and second odd sub word line driving units 232 and 234.

The first odd sub word line driving unit 232 is disposed on the other side of the first mat 212, which is parallel to the direction in which the plurality of bit lines BL0 through BLn and /BL0 through /BLn extend. The first odd sub word line driving unit 232 may drive the odd sub word lines SWL<1>, SWL<3> and SWL<5> among the plurality of sub word lines which are formed in the first mat 212.

The second odd sub word line driving unit 234 is disposed on the other side of the second mat 214, which is parallel to the direction in which the plurality of bit lines BL0 through BLn and /BL0 through /BLn extend. The second odd sub word line driving unit 234 may drive the odd sub word lines SWL<1>, SWL<3> and SWL<5> among the plurality of sub word lines which are formed in the second mat 214.

The bit line sense amplifier 240 is formed between the first and second mats 212 and 214, and includes a plurality of sense amplifier driving lines which are electrically connected with the bit lines BL0 through BLn and /BL0 through /BLn.

In particular, the bit line sense amplifier 240 according to the embodiment of the present invention has an open bit line structure and is electrically connected with the bit line bars /BL0 through /BLn among the bit lines BL0 through BLn and /BL0 through /BLn. The bit lines BL0 through BLn, which are not electrically connected with the bit line sense amplifier 240, are electrically connected with other bit line sense amplifiers (not shown) formed on one sides or the other sides of the first and second mats 212 and 214 which face or face away from the bit line sense amplifier 240.

The bit line sense amplifier 240 may be configured to amplify voltage differences between the bit line bars /BL0 through /BLn formed in the first mat 212 and the bit line bars /BL0 through /BLn formed in the second mat 214 according to a sense amplifier enable signal and thereby perform operations of reading the data of corresponding memory cells.

The first sense amplifier driving unit 250 is formed on one side of the bit line sense amplifier 240, and can drive even sense amplifier driving lines DRV_Even among the plurality of sense amplifier driving lines depending upon whether the even sub word lines SWL<0>, SWL<2> and SWL<4> formed in the first and second mats 212 and 214 are driven.

The first sense amplifier driving unit 250 includes an even sense amplifier driving signal control section and an even sense amplifier driving signal generation section as shown in FIG. 2. Since the first sense amplifier driving unit 250 according to the embodiment of the present invention is formed to have the same configuration as the first sense amplifier driving unit 150 described above with reference to the first embodiment of the present invention, detailed description thereof will be omitted herein.

The second sense amplifier driving unit 260 is formed on the other side of the bit line sense amplifier 240, and can drive odd sense amplifier driving lines DRV_Odd among the plurality of sense amplifier driving lines depending upon whether the odd sub word lines SWL<1>, SWL<3> and SWL<5> formed in the first and second mats 212 and 214 are driven.

The second sense amplifier driving unit 260 includes an odd sense amplifier driving signal control section and an odd sense amplifier driving signal generation section as shown in FIG. 3. Since the second sense amplifier driving unit 260 according to the embodiment of the present invention is formed to have the same configuration as the second sense amplifier driving unit 160 described above with reference to the first embodiment of the present invention, detailed description thereof will be omitted herein.

For example, in the semiconductor apparatus 200 in accordance with the embodiment of the present invention, when assuming that the first sub word line SWL<0> of the first even sub word line driving unit 222 is activated, charge sharing between the bit line bars /BL0 through /BLn formed in the first mat 212 and the bit line bars /BL0 through /BLn formed in the second mat 214 occurs earliest in the region A which is adjacent to the first even sub word line driving unit 222, and occurs latest in the region C which is adjacent to the first odd sub word line driving unit 232.

In the semiconductor apparatus in accordance with the embodiment of the present invention, in order to activate the sense amplifier enable signal in conformity with the timing of the region C where the charge sharing occurs latest, the first sense amplifier driving unit 250 is controlled first and the even sense amplifier driving signal DRV_Even is generated. As a consequence, by causing the bit line sense amplifier to be driven earliest in the region A and latest in the region C, data processing speed can be improved.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
   odd and even sub word line driving units configured to selectively drive odd sub word lines and even sub word lines among a plurality of sub word lines;
   a bit line sense amplifier including a plurality of sense amplifier driving lines which are electrically connected with bit lines;
   a first sense amplifier driving unit formed on one side of the bit line sense amplifier and configured to drive odd sense amplifier driving lines among the plurality of sense amplifier driving lines; and
   a second sense amplifier driving unit formed on another side of the bit line sense amplifier and configured to drive even sense amplifier driving lines among the plurality of sense amplifier driving lines according to driving of the even sub word lines.

2. The semiconductor apparatus according to claim 1, wherein the even sub word line driving unit comprises:
   a first even word line driving section configured to activate a first sub word line in response to a level of a first main word line and a first sub word line enable signal;
   a second even word line driving section configured to activate a third sub word line in response to the level of the first main word line and a third sub word line enable signal; and
   a third even word line driving section configured to activate a fifth sub word line in response to the level of the first main word line and a fifth sub word line enable signal.

3. The semiconductor apparatus according to claim 2, wherein the odd sub word line driving unit comprises:
   a first odd word line driving section configured to activate a second sub word line in response to a level of a second main word line and a second sub word line enable signal;
   a second odd word line driving section configured to activate a fourth sub word line in response to the level of the second main word line and a fourth sub word line enable signal; and
   a third odd word line driving section configured to activate a sixth sub word line in response to the level of the second main word line and a sixth sub word line enable signal.

4. The semiconductor apparatus according to claim 3, wherein the first even word line driving section comprises:
   a first transistor configured to activate the first main word line according to a high level of the first sub word line enable signal and activate the first sub word line;
   a second transistor configured to deactivate the first main word line according to a low level of the first sub word line enable signal; and
   a third transistor configured to deactivate the first sub word line in response to a level of the first sub word line enable signal.

5. The semiconductor apparatus according to claim 2, wherein the first sense amplifier driving unit comprises:
   an even sense amplifier driving signal control section configured to logically combine the first, third and fifth sub word line enable signals and a sense amplifier enable signal, and generate a preliminary even sense amplifier signal; and
   an even sense amplifier driving signal generation section configured to generate an even sense amplifier driving signal in response to a level of the preliminary even sense amplifier signal.

6. The semiconductor apparatus according to claim 3, wherein the second sense amplifier driving unit comprises:
an odd sense amplifier driving signal control section configured to logically combine the second, fourth and sixth sub word line enable signals and the sense amplifier enable signal, and generate a preliminary odd sense amplifier signal; and
an odd sense amplifier driving signal generation section configured to generate an odd sense amplifier driving signal in response to a level of the preliminary odd sense amplifier signal.

7. The semiconductor apparatus according to claim 5, wherein the even sense amplifier driving signal control section comprises:
a first even combination stage configured to logically combine the first, third and fifth sub word line enable signals;
a first even inversion stage configured to invert a level of a signal outputted from the first even combination stage;
a second even combination stage configured to logically combine a signal outputted from the first even inversion stage and the sense amplifier enable signal, and output a signal; and
a second even inversion stage configured to invert a level of the signal outputted from the second even combination stage, and generate and output the preliminary even sense amplifier signal.

8. The semiconductor apparatus according to claim 7, wherein the even sense amplifier driving signal generation section comprises:
an even switching stage configured to be turned on in response to the level of the preliminary even sense amplifier signal;
an even inversion stage configured to invert a signal outputted from the even switching stage, and generate the even sense amplifier driving signal; and
an even reset stage configured to reset the even sense amplifier driving signal generation section in response to the level of the preliminary even sense amplifier signal.

9. The semiconductor apparatus according to claim 6, wherein the odd sense amplifier driving signal control section comprises:
a first odd combination stage configured to logically combine the second, fourth and sixth sub word line enable signals;
a first odd inversion stage configured to invert a level of a signal outputted from the first odd combination stage;
a second odd combination stage configured to logically combine a signal outputted from the first odd inversion stage and the sense amplifier enable signal, and output a signal; and
a second odd inversion stage configured to invert a level of the signal outputted from the second odd combination stage, and generate and output the preliminary odd sense amplifier signal.

10. The semiconductor apparatus according to claim 9, wherein the odd sense amplifier driving signal generation section comprises:
an odd switching stage configured to be turned on in response to the level of the preliminary odd sense amplifier signal;
an odd inversion stage configured to invert a signal outputted from the odd switching stage, and generate the odd sense amplifier driving signal; and
an odd reset stage configured to reset the odd sense amplifier driving signal generation section in response to the level of the preliminary odd sense amplifier signal.

11. A semiconductor apparatus comprising:
a mat configured such that a plurality of word lines and a plurality of bit lines, which are disposed to cross each other, are coupled to each other;
a bit line sense amplifier configured to sense and amplify voltage differences between the two bit lines in response to a sense amplifier enable signal, and read data of corresponding cells in the mat;
a first sense amplifier driving unit configured to logically combine even sub word line enable signals among sub word line enable signals and the sense amplifier enable signal, and output an even sense amplifier driving signal; and
a second sense amplifier driving unit configured to logically combine odd sub word line enable signals among the sub word line enable signals and the sense amplifier enable signal, and output an odd sense amplifier driving signal.

12. The semiconductor apparatus according to claim 11, wherein the first sense amplifier driving unit comprises:
an even sense amplifier driving signal control section configured to logically combine the combination signal of the even sub word line enable signals and the sense amplifier enable signal, and generate a preliminary even sense amplifier signal; and
an even sense amplifier driving signal generation section configured to generate the even sense amplifier driving signal in response to a level of the preliminary even sense amplifier signal.

13. The semiconductor apparatus according to claim 12, wherein the even sense amplifier driving signal control section comprises:
a first NOR gate configured to logically combine the even sub word line enable signals;
a first even inversion stage configured to invert a level of the combination signal outputted from the first NOR gate;
a first NAND gate configured to logically combine a signal outputted from the first even inversion stage and the sense amplifier enable signal, and output a signal; and
a second even inversion stage configured to invert a level of the signal outputted from the first NAND gate, and generate and output the preliminary even sense amplifier signal.

14. The semiconductor apparatus according to claim 13, wherein the even sense amplifier driving signal generation section comprises:
an even switching stage configured to be turned on in response to the level of the preliminary even sense amplifier signal;
an even inversion stage configured to invert a signal outputted from the even switching stage, and generate the even sense amplifier driving signal; and
an even reset stage configured to reset the even sense amplifier driving signal generation section in response to the level of the preliminary even sense amplifier signal.

15. The semiconductor apparatus according to claim 11, wherein the second sense amplifier driving unit comprises:
an odd sense amplifier driving signal control section configured to logically combine the combination signal of the odd sub word line enable signals and the sense amplifier enable signal, and generate a preliminary odd sense amplifier signal; and
an odd sense amplifier driving signal generation section configured to generate the odd sense amplifier driving signal in response to a level of the preliminary odd sense amplifier signal.

16. The semiconductor apparatus according to claim 15, wherein the odd sense amplifier driving signal control section comprises:
- a second NOR gate configured to logically combine the odd sub word line enable signals;
- a first odd inversion stage configured to invert a level of the combination signal outputted from the second NOR gate;
- a second NAND gate configured to logically combine a signal outputted from the first odd inversion stage and the sense amplifier enable signal, and output a signal; and
- a second odd inversion stage configured to invert a level of the signal outputted from the second NAND gate, and generate and output the preliminary odd sense amplifier signal.

17. The semiconductor apparatus according to claim 16, wherein the odd sense amplifier driving signal generation section comprises:
- an odd switching stage configured to be turned on in response to the level of the preliminary odd sense amplifier signal;
- an odd inversion stage configured to invert a signal outputted from the odd switching stage, and generate the odd sense amplifier driving signal; and
- an odd reset stage configured to reset the odd sense amplifier driving signal generation section in response to the level of the preliminary odd sense amplifier signal.

18. A semiconductor apparatus comprising:
- a first sense amplifier driving signal control section configured to logically combine even row sub word line enable signals and a sense amplifier enable signal, and generate an even row sense amplifier signal;
- a first sense amplifier driving signal generation section configured to generate an even row sense amplifier driving signal in response to a level of the even row sense amplifier signal;
- a second sense amplifier driving signal control section configured to logically combine odd row sub word line enable signals and the sense amplifier enable signal, and generate an odd row sense amplifier signal; and
- a second sense amplifier driving signal generation section configured to generate an odd row sense amplifier driving signal in response to a level of the odd row sense amplifier signal.

19. The semiconductor apparatus according to claim 18, wherein the first sense amplifier driving signal control section comprises:
- a first NOR gate configured to logically combine the even row sub word line enable signals;
- a first inversion stage configured to invert the combination signal outputted from the first NOR gate;
- a first NAND gate configured to logically combine a signal outputted from the first even inversion stage and the sense amplifier enable signal, and output a signal; and
- a second inversion stage configured to invert a level of the signal outputted from the first NAND gate, and generate and output the even row sense amplifier signal.

20. The semiconductor apparatus according to claim 19, wherein the first sense amplifier driving signal generation section comprises:
- a first switching stage configured to be turned on in response to the level of the even row sense amplifier signal;
- a third inversion stage configured to invert a signal outputted from the first switching stage, and generate the even row sense amplifier driving signal; and
- a first reset stage configured to reset the first sense amplifier driving signal generation section in response to the level of the even row sense amplifier signal.

21. The semiconductor apparatus according to claim 18, wherein the second sense amplifier driving signal control section comprises:
- a second NOR gate configured to logically combine the odd row sub word line enable signals;
- a fourth inversion stage configured to invert the combination signal outputted from the second NOR gate;
- a second NAND gate configured to logically combine a signal outputted from the fourth inversion stage and the sense amplifier enable signal, and output a signal; and
- a fifth inversion stage configured to invert a level of the signal outputted from the second NAND gate, and generate and output the odd row sense amplifier signal.

22. The semiconductor apparatus according to claim 21, wherein the second sense amplifier driving signal generation section comprises:
- a second switching stage configured to be turned on in response to the level of the odd row sense amplifier signal;
- a sixth inversion stage configured to invert a signal outputted from the second switching stage, and generate the odd row sense amplifier driving signal; and
- a second reset stage configured to reset the second sense amplifier driving signal generation section in response to the level of the odd row sense amplifier signal.

23. A semiconductor apparatus comprising:
- a mat configured such that a plurality of word lines and a plurality of bit lines cross each other and are coupled to each other, and including a plurality of memory cells;
- a sub word line driving unit configured to selectively drive odd sub word lines or even sub word lines among the plurality of word lines;
- a bit line sense amplifier configured to sense and amplify voltage differences between the two bit lines in response to a sense amplifier enable signal which is applied from outside, and perform operations of reading data of corresponding memory cells; and
- a sense amplifier driving unit configured to generate and output an even sense amplifier driving signal or an odd sense amplifier driving signal in correspondence to a direction in which the even sub word lines or the odd sub word lines are driven.

24. The semiconductor apparatus according to claim 23, wherein sub word line driving unit comprises:
- an even word line driving unit configured to activate corresponding even sub word lines in response to a level of a first main word line and even sub word line enable signals which are inputted from outside; and
- an odd word line driving unit configured to activate corresponding odd sub word lines in response to a level of a second main word line and odd sub word line enable signals which are inputted from the outside.

25. The semiconductor apparatus according to claim 24, wherein the even word line driving unit comprises:
- a first even transistor configured to activate a corresponding even sub word line according to the level of the first main word line in response to any one signal among the even sub word line enable signals which has a high level;
- a second even transistor configured to deactivate the first main word line in response to any one signal among the even sub word line enable signals which has a low level; and a third even transistor configured to selectively activate the corresponding even sub word line in response to the level of the first main word line.

26. The semiconductor apparatus according to claim 25, wherein the odd word line driving unit comprises:
a first odd transistor configured to activate a corresponding odd sub word line according to the level of the second main word line in response to any one signal among the odd sub word line enable signals which has a high level;
a second odd transistor configured to deactivate the second main word line in response to any one signal among the odd sub word line enable signals which has a low level; and
a third odd transistor configured to selectively activate the corresponding odd sub word line in response to the level of the second main word line.

27. The semiconductor apparatus according to claim 26, wherein the sense amplifier driving unit comprises:
a first sense amplifier driving unit including an even sense amplifier driving signal control section configured to logically combine the even sub word line enable signals and the sense amplifier enable signal and generate a preliminary even sense amplifier signal, and an even sense amplifier driving signal generation section configured to generate the even sense amplifier driving signal in response to a level of the preliminary even sense amplifier signal; and
a second sense amplifier driving unit including an odd sense amplifier driving signal control section configured to logically combine the odd sub word line enable signals and the sense amplifier enable signal and generate a preliminary odd sense amplifier signal, and an odd sense amplifier driving signal generation section configured to generate the odd sense amplifier driving signal in response to a level of the preliminary odd sense amplifier signal.

28. The semiconductor apparatus according to claim 27, wherein the even sense amplifier driving signal control section comprises:
a first even combination stage configured to logically combine the even sub word line enable signals;
a first even inversion stage configured to invert the combination signal outputted from the first even combination stage;
a second even combination stage configured to logically combine a signal outputted from the first even inversion stage and the sense amplifier enable signal, and output a signal; and
a second even inversion stage configured to invert a level of the signal outputted from the second even combination stage, and generate and output the preliminary even sense amplifier signal.

29. The semiconductor apparatus according to claim 28, wherein the even sense amplifier driving signal generation section comprises:
an even switching stage configured to be turned on in response to the level of the preliminary even sense amplifier signal;
an even inversion stage configured to invert a signal outputted from the even switching stage, and generate the even sense amplifier driving signal; and
an even reset stage configured to reset the even sense amplifier driving signal generation section in response to the level of the preliminary even sense amplifier signal.

30. The semiconductor apparatus according to claim 27, wherein the odd sense amplifier driving signal control section comprises:
a first odd combination stage configured to logically combine the odd sub word line enable signals;
a first odd inversion stage configured to invert a level of the combination signal outputted from the first odd combination stage;
a second odd combination stage configured to logically combine a signal outputted from the first odd inversion stage and the sense amplifier enable signal, and output a signal; and
a second odd inversion stage configured to invert a level of the signal outputted from the second odd combination stage, and generate and output the preliminary odd sense amplifier signal.

31. The semiconductor apparatus according to claim 30, wherein the odd sense amplifier driving signal generation section comprises:
an odd switching stage configured to be turned on in response to the level of the preliminary odd sense amplifier signal;
an odd inversion stage configured to invert a signal outputted from the odd switching stage, and generate the odd sense amplifier driving signal; and
an odd reset stage configured to reset the odd sense amplifier driving signal generation section in response to the level of the preliminary odd sense amplifier signal.

32. A semiconductor apparatus comprising:
a bit line sense amplifier configured to amplify voltage differences between bit lines of a first mat and bit lines of a second mat in response to an even sense amplifier driving signal or an odd sense amplifier driving signal, and read data of the first mat or the second mat;
a first sense amplifier driving unit configured to combine a combination signal of even sub word line enable signals among sub word line enable signals and a sense amplifier enable signal, and output the even sense amplifier driving signal; and
a second sense amplifier driving unit configured to combine a combination signal of odd sub word line enable signals among the sub word line enable signals and the sense amplifier enable signal, and output the odd sense amplifier driving signal.

33. The semiconductor apparatus according to claim 32, wherein the first sense amplifier driving unit is formed on one side of the bit line sense amplifier.

34. The semiconductor apparatus according to claim 32, wherein the second sense amplifier driving unit is formed on the other side of the bit line sense amplifier.

35. The semiconductor apparatus according to claim 33, further comprising:
first and second even sub word line driving units respectively formed on one sides of the first and second mats and configured to selectively drive even sub word lines among a plurality of sub word lines.

36. The semiconductor apparatus according to claim 35, wherein the first even sub word line driving unit is formed on one side of the first sense amplifier driving unit.

37. The semiconductor apparatus according to claim 35, wherein the second even sub word line driving unit is formed on the other side of the first sense amplifier driving unit.

38. The semiconductor apparatus according to claim 33, further comprising:
first and second odd sub word line driving units respectively formed on the other sides of the first and second mats and configured to selectively drive odd sub word lines among the plurality of sub word lines.

39. The semiconductor apparatus according to claim 38, wherein the first odd sub word line driving unit is formed on one side of the second sense amplifier driving unit.

40. The semiconductor apparatus according to claim 38, wherein the second odd sub word line driving unit is formed on the other side of the second sense amplifier driving unit.

41. A semiconductor apparatus comprising:
first and second mats;
a plurality of sub word line driving units configured to selectively drive odd sub word lines and even sub word lines;
a bit line sense amplifier configured to amplify voltage differences between bit lines of the first mat and bit lines of the second mat in response to an even sense amplifier driving signal or an odd sense amplifier driving signal, and read data of the first mat or the second mat; and
a sense amplifier driving unit configured to generate and output the even sense amplifier driving signal or the odd sense amplifier driving signal in correspondence to a direction in which the even sub word lines or the odd sub word lines are driven.

* * * * *